United States Patent
Agemura et al.

(10) Patent No.: US 8,455,820 B2
(45) Date of Patent: Jun. 4, 2013

(54) COMPOSITE CHARGED PARTICLE BEAMS APPARATUS

(75) Inventors: Toshihide Agemura, Tsuchiura (JP); Tsunenori Nomaguchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 43 days.

(21) Appl. No.: 13/266,404

(22) PCT Filed: Apr. 14, 2010

(86) PCT No.: PCT/JP2010/002680
§ 371 (c)(1),
(2), (4) Date: Oct. 26, 2011

(87) PCT Pub. No.: WO2010/125754
PCT Pub. Date: Nov. 4, 2010

(65) Prior Publication Data
US 2012/0043463 A1    Feb. 23, 2012

(30) Foreign Application Priority Data
Apr. 28, 2009    (JP) .................................. 2009 108646

(51) Int. Cl.
*H01J 37/26*    (2006.01)
(52) U.S. Cl.
CPC ...................................... *H01J 37/26* (2013.01)
USPC .......................................... 250/306; 250/310
(58) Field of Classification Search
USPC ................................................. 250/306, 310
See application file for complete search history.

(56) References Cited

U.S. PATENT DOCUMENTS

| 4,962,306 A | 10/1990 | Hodgson et al. |
| 5,408,098 A | 4/1995 | Wells |

(Continued)

FOREIGN PATENT DOCUMENTS

| JP | 3-182039 | 8/1991 |
| JP | 5-109379 | 4/1993 |

(Continued)

OTHER PUBLICATIONS

Oliver C. Wells, "New Contrast Mechanism for Scanning Electron Microscope", Applied Physics Letters vol. 16, No. 4, pp. 151. Feb. 15, 1970.

(Continued)

*Primary Examiner* — Kiet T Nguyen
(74) *Attorney, Agent, or Firm* — McDermott Will & Emery LLP

(57) ABSTRACT

A composite charged particle beams apparatus of the present invention allows a sample (5)'s cross-section or edge plane to be observed by using an electron beam (2b), the sample (5)'s cross-section or edge plane being fabricated by using an ion beam (1b). The radiation device includes a detector (7) which is capable of detecting low-loss back-scattered electrons (12) including elastically-scattered electrons (11), these electrons (12, 11) being induced by the electron beam (2b) with which the sample (5)'s cross-section or edge plane is irradiated. Moreover, it is desirable that the detector (7) be set up in a space outside an electron-beam column (2a). The above-described configuration has allowed implementation of the high-resolving-power and low-damage SEM observation of the surface information about material and composition of the sample's FIB-fabricated cross-section or edge plane. Furthermore, when detecting the low-loss back-scattered electrons (12), information about the different depths relative to the sample's surface has been also made available by selecting the energy bands of the detected electrons.

37 Claims, 10 Drawing Sheets

U.S. PATENT DOCUMENTS

| | | | |
|---|---|---|---|
| 6,627,889 B2* | 9/2003 | Ochiai et al. | 850/9 |
| 7,202,476 B2* | 4/2007 | Suga et al. | 250/310 |
| 2007/0187597 A1 | 8/2007 | Suzuki et al. | |
| 2009/0020698 A1* | 1/2009 | Muto et al. | 250/310 |

FOREIGN PATENT DOCUMENTS

| | | |
|---|---|---|
| JP | 2001-084951 | 3/2001 |
| JP | 2004-022318 | 1/2004 |
| JP | 2007-214088 | 8/2007 |

OTHER PUBLICATIONS

Oliver C. Wells, "Low-Loss Image for Surface Scanning Electron Microscope", Applied Physics Letters vol. 19, No. 7, pp. 232. Oct. 1, 1971.

Oliver C. Wells, "Method for Examining Solid Specimens with Improved Resolution in the Scanning Electron Microscope", Applied Physics Letters vol. 23, No. 6, pp. 353. Sep. 15, 1973.

Oliver C. Wells, "Reciprocity Between the Reflection Electron Microscope and the Low-Loss Scanning Electron Microscope", Applied Physics Letters vol. 37, No. 6, pp. 506. Sep. 15, 1980.

Oliver C. Wells, "Low Loss Electron Images of Uncoated Photoresist in the Scanning Electron Microscope", Applied Physics Letters, vol. 49, No. 13, pp. 765. Sep. 29, 1986.

Oliver C. Wells, "Scanning Reflection Image from a Solid Specimen in the Scanning Electron Microscope with a Condenser-Objective Lens", Scanning vol. 10, pp. 73-81. Jan. 1, 1988.

Oliver C. Wells, "Magnetically Filtered Low-Loss Scanning Electron Microscopy", Applied Physics Letters vol. 56, pp. 2351. Jun. 4, 1990.

* cited by examiner (A) 15-kV ACCELERATION VOLTAGE,
SECONDARY-ELECTRON SEM IMAGE (B) 15-kV ACCELERATION VOLTAGE,
5-% (750-V) ENERGY-LOSS-ELECTRON SEM IMAG (a)

INSIDE-Si MUTUAL-INTERACTION AREAS AT
THE TIME OF 15-kV AND 1-kV ACCELERATION VOLTAGES (b)

FIB-FABRICATED CROSS-SECTION

HORIZONTAL-SURFACE-DIRECTION CROSS-SECTION

INSIDE-100-nm-THICK-Si MUTUAL-INTERACTION AREAS

US 8,455,820 B2

COMPOSITE CHARGED PARTICLE BEAMS APPARATUS

RELATED APPLICATIONS

This application is the U.S. National Phase under 35 U.S.C. §371 of International Application No. PCT/JP2010/002680, filed on Apr. 14, 2010, which in turn claims the benefit of Japanese Application No. 2009-108646, filed on Apr. 28, 2009, the disclosures of which Applications are incorporated by reference herein.

TECHNICAL FIELD

The present invention relates to a composite charged particle beams apparatus for allowing a sample, which is fabricated by using an ion beam, to be observed by using an electron beam.

BACKGROUND ART

In recent years, a focused-ion-beam (:FIB) device has come into a wide use for the formation of a thin-film sample dedicated for a (scanning) transmission electron microscope (:(S) TEM). In particular, in the formation of a thin-film sample dedicated for semiconductor-device failure analysis, it is wished in almost all cases to stop the FIB fabrication at the location of a specific cross-section of the semiconductor device. Accordingly, there has occurred a prevailing use of a FIB-SEM dual-beam device which allows the FIB-fabricated cross-section to be observed by the scanning electron microscope (:SEM). At this time, it is common to perform the image observation in such a manner that secondary electrons (:SEs), which reflect surface information and topographic information about the sample, are employed as the signal for the observation.

Also, in the SEM, in some cases, the image observation is performed in such a manner that back-scattered electrons (:BSEs), which reflect material information and composition information about the sample, are employed as the signal for the observation. The BSEs are the generic designation for electrons which have emitted from the sample in accompaniment with a wide range of energy distribution from 50 eV to incident energy of the electron beam used in the SEM. Of the BSEs, there are two types of reflected electrons, i.e., reflected electrons which have undergone completely elastic scatterings, and thus exhibit no energy loss, and reflected electrons which have been emitted after undergoing only a few times of mutual interactions with the electron beam inside the sample, and thus exhibit less energy loss. In the present specification, these two types of reflected electrons will altogether be referred to as "low-loss electrons (:LLEs)". Because of no or less mutual interaction between the electron beam and the sample, the LLEs are regarded as being electrons which have not intruded into the inside of the sample, i.e., electrons which have the surface information about the sample.

Incidentally, the LLE detection in the SEM had been publicized in 1970 by a group whose leader is Oliver C. Wells. In theses and patent specifications presented by Wells et al., the description has been given concerning the acquisition of contrasts including the surface information, material information, and composition information about the sample at a high acceleration voltage in the single-unit SEM.

CITATION LIST

Patent Literature

PATENT LITERATURE 1: U.S. Pat. No. 4,962,306
PATENT LITERATURE 2: U.S. Pat. No. 5,408,098
PATENT LITERATURE 3: JP-A-3-182039

Non Patent Literature

NON PATENT LITERATURE 1: Oliver C. Wells, Applied Physics Letters Vol. 16 No. 4 (1970) p. 151
NON PATENT LITERATURE 2: Oliver C. Wells, Applied Physics Letters Vol. 19 No. 7 (1971) p. 232
NON PATENT LITERATURE 3: Oliver C. Wells et al., Applied Physics Letters Vol. 23 No. 6 (1973) p. 353
NON PATENT LITERATURE 4: Oliver C. Wells, Applied Physics Letters Vol. 37 No. 6 (1980) p. 507
NON PATENT LITERATURE 5: Oliver C. Wells, Applied Physics Letters Vol. 49 No. 13 (1986) p. 764
NON PATENT LITERATURE 6: Oliver C. Wells, Scanning Vol. 10 (1988) p. 73
NON PATENT LITERATURE 7: Oliver C. Wells et al., Applied Physics Letters Vol. 56 No. 23 (1990) p. 2351

SUMMARY OF INVENTION

Technical Problem

The present-application inventor has made an enthusiastic and concentrated investigation as to the formation of a thin-film sample dedicated for the (S) TEM using the FIB-SEM dual-beam device. As a consequence, the inventor has eventually acquired the following findings:

In the most advanced semiconductor devices, it is becoming more and more common to apply a device whose node size is equal to 30 nm or less. In the formation of a thin-film sample of a device like this, it is required to stop the fabrication at the location of a target cross-section in accompaniment with a nano-meter-level accuracy. This requirement makes it important to acquire the SEM image of the sample's surface.

In the SEM, the image observation is performed in such a manner that the secondary electrons (:SEs), which reflect the composition information and topographic information in proximity to the sample's surface, are employed as the signal for the observation. The FIB-fabricated cross-section and edge plane, however, are exceedingly planar. This condition makes it difficult to judge and identify a specific cross-section of the sample on the basis of the topographic information. Also, the SEs are emitted in the case of the ion beam as well. Accordingly, performing the SEM observation simultaneously with the FIB fabrication is made implementable only in a limited case where the flowing condition is satisfied: The current amount of the electron beam is, e.g., more than ten times larger than the current amount of the ion beam, and the SEM image is acquired in a rapid and short scanning time.

Meanwhile, in the SEM, the image observation can also be performed in such a manner that the back-scattered electrons (:BSEs), which reflect the material information and composition information about the sample, are employed as the signal for the observation. The BSEs are not emitted in the case of the ion beam. Accordingly, it becomes implementable to perform the simultaneous driving of the FIB fabrication and the SEM observation. Here, however, a BSE-detecting condition depends on the sensitivity of a BSE detector. Consequently, performing the BSE detection simultaneously with the FIB fabrication generally requires that the acceleration voltage of the SEM be set at 5 kV or more. Increasing the acceleration voltage, however, enlarges the mutual-interaction area between the electron beam and the sample. This situation causes the BSE to be emitted from the inside of the sample as well, thereby making it difficult to obtain the information about the sample's surface. Reducing the mutual-interaction area between the electron beam and the sample requires that the acceleration voltage of the SEM be set at a lower value. Nowadays, it is becoming more and more common to manufacture and use a SEM which is capable of detecting the BSE signal even at a 5-kV-or-less acceleration voltage. Unfortunately, the employment of the lower acceleration voltage, in turn, gives rise to the occurrence of the following problem: The probe diameter of the electron beam becomes larger, and thus its resolving power becomes lowered.

The citable methods for decreasing the probe diameter of the electron beam in the low-acceleration-voltage SEM are as follows: A retarding method whereby a strong negative potential is applied to the sample, and a boosting method whereby the electron beam is accelerated inside a SEM column, and is decelerated down to the initial acceleration voltage directly before an out-lens pole piece for not permitting a magnetic field to leak out into the sample. In the former, i.e., the retarding method, the negative potential, which is uniform, is required to be applied to the sample. Accordingly, it is very difficult to apply the retarding method to the FIB-fabricated sample, where there exists none of a wide range of flat plane on which the potential can be made uniform. In the latter, i.e., the boosting method, the effect that the probe diameter becomes smaller can be conspicuously exhibited in the following case: The distance ranging from the front-end of the SEM objective lens to the sample (which is referred to as "working distance (:WD)") is shortened down to 3 mm or less. Unfortunately, in the FIB-SEM dual-beam device on which a FIB column and the SEM column are mounted, it is extremely difficult to assemble the cross point (:CP) of the ion beam and the electron beam down to 3 mm or less. After the FIB fabrication, depending on the profile of the sample, it is possible to bring the cross-section, whose SEM observation is wished to be performed, nearer to the SEM-objective-lens side from the CP. In this case, however, it is impossible to perform the SEM observation simultaneously with the FIB fabrication. What is more, the stage is required to be displaced, which lowers the operation efficiency. Also, when an additional fabrication is performed using the FIB, the reproduction accuracy of the fabricated position is tremendously lowered. Basically the same drawbacks can also be pointed out in the function that is characteristic of the FIB-SEM dual-beam device (which is referred to as "Mill & Monitor function"), i.e., the function of repeating the FIB fabrication and the SEM observation.

In particular, in recent years, there have been higher and higher observation needs for materials which are damaged by the electron-beam irradiation. Examples of such materials are as follows: A low-dielectric-constant semiconductor-device material referred to as "Low-k material", and polymer-based or light-element-composed functional materials. When the thin-film sample dedicated for the TEM observation is formed using the FIB fabrication, it turns out that the employment of the low acceleration voltage in the SEM observation causes more damage to the sample. Meanwhile, the employment of the high acceleration voltage permits most of the electron beam to pass through the sample (although this passing-through property depends on the sample's material as well). This condition makes it possible to tremendously suppress the damage to be caused to the sample.

It is an object of the present invention to perform the SEM observation of the FIB-fabricated surface with a high resolving power and a low damage.

Solution to Problem

In the present invention, in a composite charged particle beams apparatus for allowing a sample's cross-section or edge plane to be observed by using an electron beam, the sample's cross-section or edge plane being fabricated by using an ion beam, there is provided a detector which is capable of detecting low-loss back-scattered electrons including elastically-scattered electrons, these electrons being induced by the electron beam with which the sample's cross-section or edge plane is irradiated. It is desirable that the detector be set up in a space outside an electron-beam column.

Advantageous Effects of Invention

The present invention allows implementation of the high-resolving-power and low-damage SEM observation of the surface information about material and composition of the sample's FIB-fabricated cross-section or edge plane. Moreover, information about the different depths relative to the sample's surface is also made available by changing the energy bands to be selected.

DESCRIPTION OF EMBODIMENTS

Figure 1:
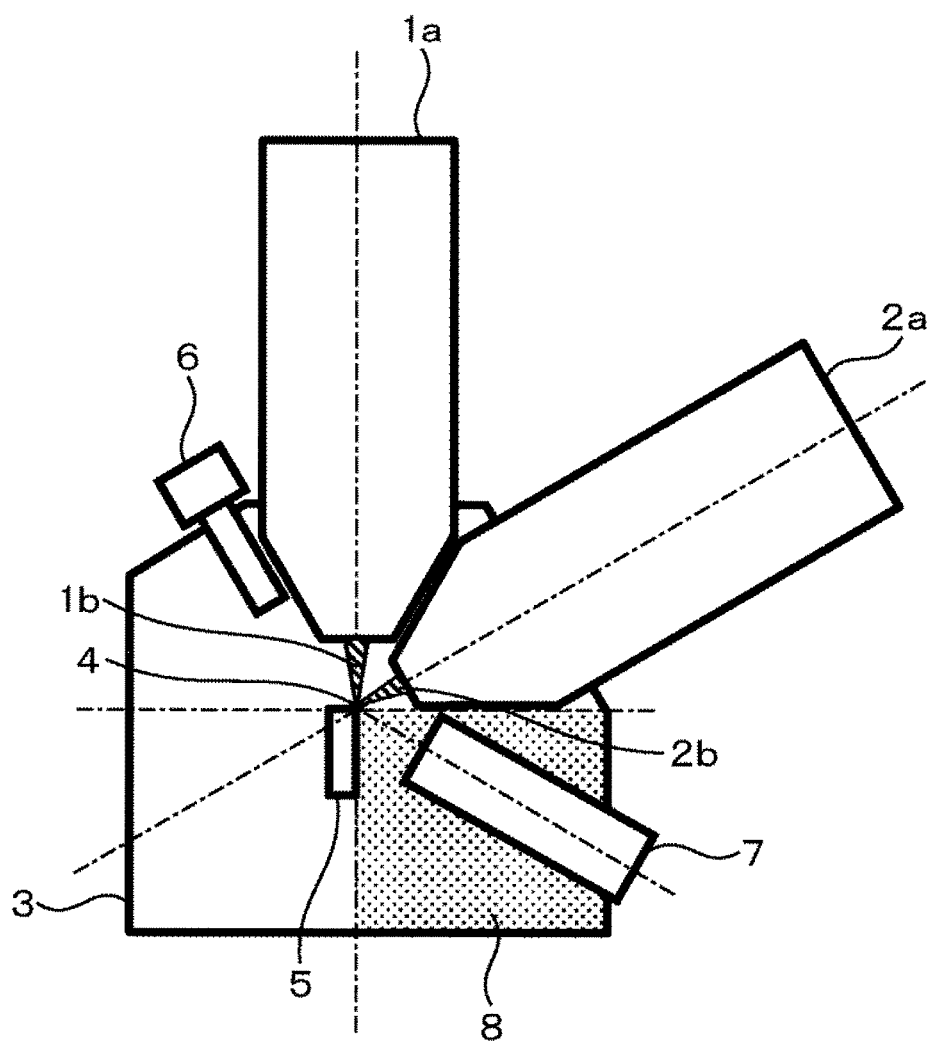
FIG. 1 is a longitudinal cross-sectional diagram for illustrating an embodiment of configuration of the composite charged particle beams apparatus.

In an embodiment, there is disclosed a composite charged particle beams apparatus for observing a sample's cross-section by using an electron beam, the sample's cross-section being formed by using an ion-beam fabrication, wherein the device includes a detector for detecting low-loss back-scattered electrons including elastically-scattered electrons, the low-loss back-scattered electrons being induced by the electron beam with which the sample's cross-section is irradiated.

Also, in an embodiment, there is disclosed the device, wherein the detector is deployed in a three-dimensional area which is oriented in a direction, the direction being implemented as a result of performing a 90°-or-more rotation from an ion-beam incident axis into the cross-section such that a cross point of the ion beam and the electron beam is employed as center of the rotation.

Also, in an embodiment, there is disclosed the device, wherein the detector is deployed at an angle at which angle distribution of the back-scattered electrons exhibits the highest intensity, the angle distribution depending on an electron-beam incident angle into the cross-section.

Also, in an embodiment, there is disclosed the device, wherein the detector is deployed in a direction, and at an angle, the direction being away from the ion-beam incident axis with an electron-beam incident axis employed as its criterion, the angle being two times as large as an electron-beam incident angle into the sample.

Also, in an embodiment, there is disclosed the device, wherein the detector is capable of detecting the low-loss back-scattered electrons in a case where acceleration voltage of the electron beam is set at its maximum value.

Also, in an embodiment, there is disclosed the device, wherein the detector is capable of detecting the low-loss back-scattered electrons in a case where acceleration voltage of the electron beam is set within a range of 1.5 kV to 30 kV.

Also, in an embodiment, there is disclosed the device, wherein surface information about the sample's cross-section can be acquired while the fabrication of the sample's cross-section by using the ion beam is underway.

Also, in an embodiment, there is disclosed the device, wherein surface information about the sample's cross-section can be acquired after the fabrication onto the sample's cross-section by using the ion beam is stopped.

Also, in an embodiment, there is disclosed the device, wherein the fabrication of the sample's cross-section by using the ion beam, and acquisition of surface information about the sample's cross-section can be carried out repeatedly.

Also, in an embodiment, there is disclosed the device, further including a second detector for detecting an electron beam which has passed through a thin-film sample, and wherein surface information about the sample's cross-section and inner information about the thin-film sample can be simultaneously acquired while fabrication of the thin-film sample by using the ion beam is underway.

Also, in an embodiment, there is disclosed the device, further including a second detector for detecting an electron beam which has passed through a thin-film sample, and wherein surface information about the sample's cross-section and inner information about the thin-film sample can be simultaneously acquired after fabrication onto the thin-film sample by using the ion beam is stopped.

Also, in an embodiment, there is disclosed the device, further including a second detector for detecting an electron beam which has passed through a thin-film sample, and wherein the fabrication of the sample's cross-section by using the ion beam, acquisition of surface information about the thin film's cross-section, and acquisition of inner information about the thin film can be carried out repeatedly.

Also, in an embodiment, there is disclosed the device, wherein thickness of the thin-film sample is equal to 300 nm or less.

Also, in an embodiment, there is disclosed the device, wherein surface-information images of the sample's cross-section are acquired when the ion-beam fabrication and the electron-beam observation are repeated on each specific-fabrication-step basis, and the surface-information images can be three-dimensionally reconstructed by superimposing the surface-information images on each other on the basis of a fabrication step's width or an arbitrary width.

Also, in an embodiment, there is disclosed the device, wherein the fabrication step's width is equal to 5 nm or less.

Also, in an embodiment, there is disclosed the device, further including a display for displaying a detection signal from the detector by forming an image of the detection signal, and wherein an arbitrary range of the image displayed on the display is selected, and the selected range is image-displayed on the display.

Hereinafter, referring to the drawings, the explanation will be given below concerning the above-described and other new features and effects of the present invention. Incidentally, the drawings are specifically used for the understanding of the present invention. Accordingly, the drawings do not reduce and limit the scope of the appended claims at all.

EMBODIMENTS

FIG. 1 is a schematic diagram of the FIB-SEM dual-beam device in the present embodiment.

A reference numeral $1a$ denotes an ion-beam column, i.e., a system including all of the configuration components needed for the FIB, such as an ion source for generating the ion beam, a lens for focusing the ion beam, and a deflection system for scanning and shifting the ion beam. Similarly, a numeral $2a$ denotes an electron-beam column, i.e., a system including all of the configuration components needed for the SEM, such as an electron source for generating the electron beam, a lens for focusing the electron beam, and a deflection system for scanning and shifting the electron beam. The ion-beam column $1a$ and the electron-beam column $2a$ are mounted on a sample chamber 3. Incidentally, in the present embodiment, the ion-beam column $1a$ is vertically deployed, and the electron-beam column $2a$ is obliquely deployed. The deployment of these columns, however, is not limited thereto. Namely, the ion-beam column $1a$ may be obliquely deployed, and the electron-beam column $2a$ may be vertically deployed. Also, both of the ion-beam column $1a$ and the electron-beam column $2a$ may be obliquely deployed. Also, there may be provided the triple-column configuration, where a Ga focused-ion-beam column, an Ar focused-ion-beam column, and the electron-beam column are set up.

In addition to the above-described two columns, components such as a sample stage, a gas deposition unit, and a micro sampling unit are also mounted on the sample chamber 3. The sample stage for transporting a sample 5 is capable of mounting the sample 5 thereon, and performing plane displacement and rotation displacement. Also, the sample stage is capable of displacing a region, which is needed for the ion-beam-based fabrication and observation, to an ion-beam irradiation position or an electron-beam-based observation position. Incidentally, in addition to semiconductor, the materials assumable as the sample 5 are such substances as steel, light metal, and polymer-based macromolecule. The gas deposition unit, which is used for protection-film formation and marking, is capable of storing a deposition gas, and supplying the deposition gas depending on the requirements.

Here, the deposition gas forms a deposition film by being irradiated with a charged-particle beam. The micro sampling unit picks up a specific region of the sample on the basis of co-use with the FIB-based sample fabrication or cutting. The micro sampling unit includes a probe which is capable of displacing inside the sample chamber 3 on the basis of a probe-driving unit. The probe is used for extracting a microscopic sample fragment formed in the sample, or supplying electric potential to the sample by being brought into contact with the sample's surface.

The ion beam 1b and the electron beam 2b pass through the respective columns, then crossing each other at a single point (which is referred to as "cross point") of the sample 5. Secondary electrons are generated when the sample 5 is irradiated with the ion beam 1b or the electron beam 2b. Then, the secondary electrons generated are detected by a secondary-electron detector 6 which is installed in the sample chamber 3. Moreover, in the present embodiment, a low-loss-electron detector 7 is deployed in an area 8 in which a detector is to be deployed. Here, the area 8 is implemented as a result of performing a 90°-or-more rotation from the ion-beam column 1a to the side of the electron-beam column 2a. The area 8 is a three-dimensional space which includes a spread from the drawing's frontward side into the drawing's depth direction. Furthermore, detection signals from the secondary-electron detector 6 or the low-loss-electron detector 7 are subjected to a calculation processing by a calculation processing unit, thereby being formed into images. Then, the images, such as secondary-electron image, secondary-ion image, characteristic-X-rays-based element map, and transmitted-electron image, are displayed on a display. Also, the calculation processing unit is capable of controlling the ion-beam column 1a, the electron-beam column 2a, the secondary-electron detector 6, the low-loss-electron detector 7, the sample stage, the gas deposition unit, and the micro sampling unit, respectively.

Figure 2:
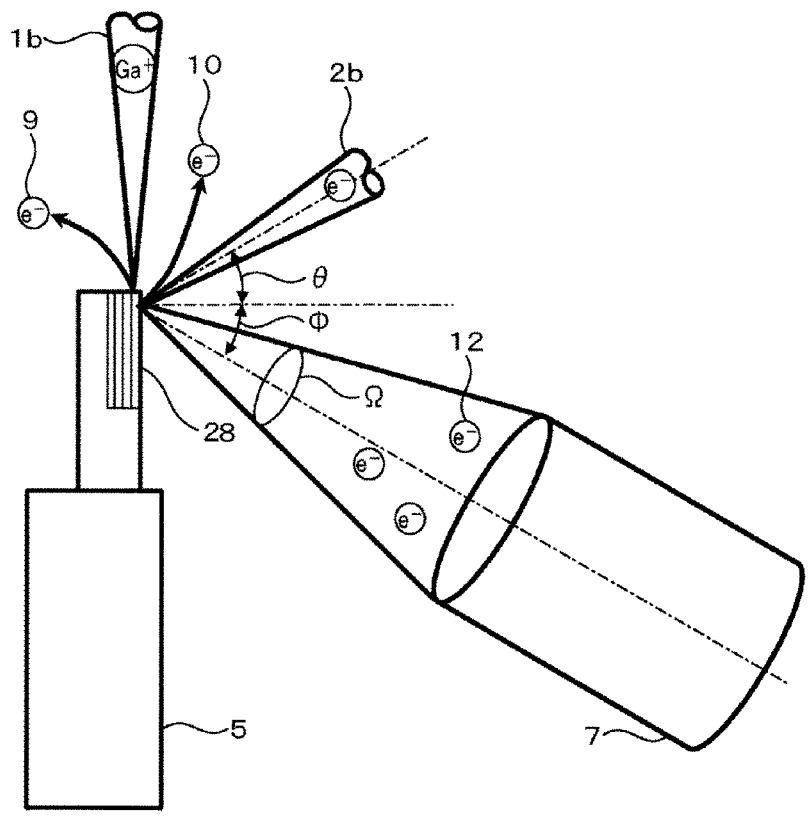
FIG. 2 is a schematic diagram for illustrating the details in proximity to the cross point of the composite charged particle beams apparatus illustrated in FIG. 1.

FIG. 2 is a diagram where the region in proximity to the cross point 4 illustrated in FIG. 1 is enlarged. Although, typically, gallium ions are used as the ion beam 1b, the ion type presents no problem as long as the object is to fabricate the cross-section. A surface 28, which is irradiated with the electron beam 2b on the sample 5, is the FIB-fabricated cross-section or edge plane. The ion beam 1b continues to dig the FIB-fabricated cross-section 28 sequentially in the cross-section direction. Both the secondary electrons 9 induced by the ion beam 1b and the secondary electrons 10 induced by the electron beam 2b are detected by the secondary-electron detector 6. Meanwhile, back-scattered electrons (:BSEs) 11, which are induced by the electron beam 2b, are released from inside the sample out into the vacuum in accompaniment with an energy distribution as is illustrated in FIG. 3 and an angle distribution as is illustrated in FIG. 4.

Figure 3:
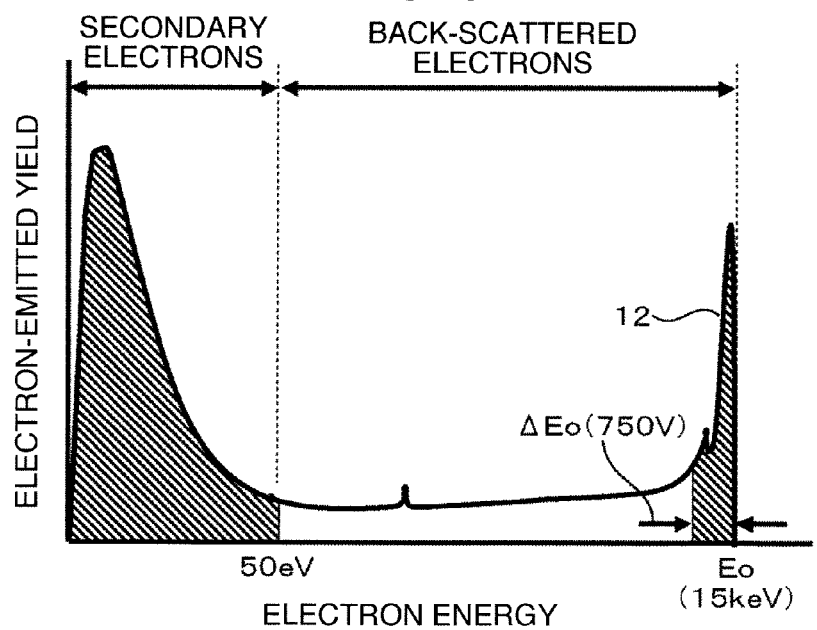
FIG. 3 is a diagram for illustrating an energy distribution of the yield of electrons emitted from the sample.

FIG. 3 illustrates the energy distribution of yield of the BSEs. Here, a reference numeral 12 represents low-loss reflected electrons included in an energy area in proximity to the acceleration voltage of the primary electron beam. From an actual and practical standpoint, consideration is given to a lost energy amount $\Delta Eo$ which is lost with reference to the acceleration energy Eo. Then, in an application for observing the sample's surface image, it is desirable to detect the low-loss electrons whose energy loss is equal to 20% or less of the acceleration energy. Selectively detecting this energy range of BSEs, i.e., LLEs, makes it possible to acquire the surface, material, and composition contrasts about the sample. Moreover, it becomes also possible to observe a change in the information in the depth direction from the sample's surface to its inside, depending on the energy width selected. Also, in this energy range, there are some cases where, in addition to elastically-scattered electrons (i.e., reflected electrons), there appear several peaks which characterize the mutual interaction between the electrons and the inside of the sample. Accordingly, it is possible not only to detect, from Eo-$\Delta Eo$, all of the electrons which fall within the Eo range, but also to extract only an energy range of the specific peaks which have occurred. Furthermore, in addition to the method of determining $\Delta Eo$ from the energy loss relative to Eo, it is also possible to determine $\Delta Eo$ from a lowering amount in the peak yield which is present in the area 12 in FIG. 3. In the application for observing the sample's surface image, it is desirable to define the following range as being $\Delta Eo$: A range ranging from the lower-energy-side energy of a yield, which corresponds to a 40%-or-less lowering amount of the peak yield (i.e., 60% of the peak yield), to the acceleration energy Eo.

The LLEs have information in shallow proximity to the sample's surface. Consequently, selectively detecting this information makes it possible to acquire the material and composition contrasts about the sample's shallow surface. Moreover, it becomes possible to observe the change in the information in the depth direction from the sample's surface to its inside, depending on the energy width selected. Meanwhile, in the FIB-SEM dual-beam device, as is obvious from FIG. 2, the electron beam 2b enters the sample 5 at a certain angle $\theta$. As a result of this incident angle $\theta$ of the electron beam 2b, the BSEs 11 emitted from the sample 5 have its intensity distribution at an angle $\Phi$.

Figure 4:
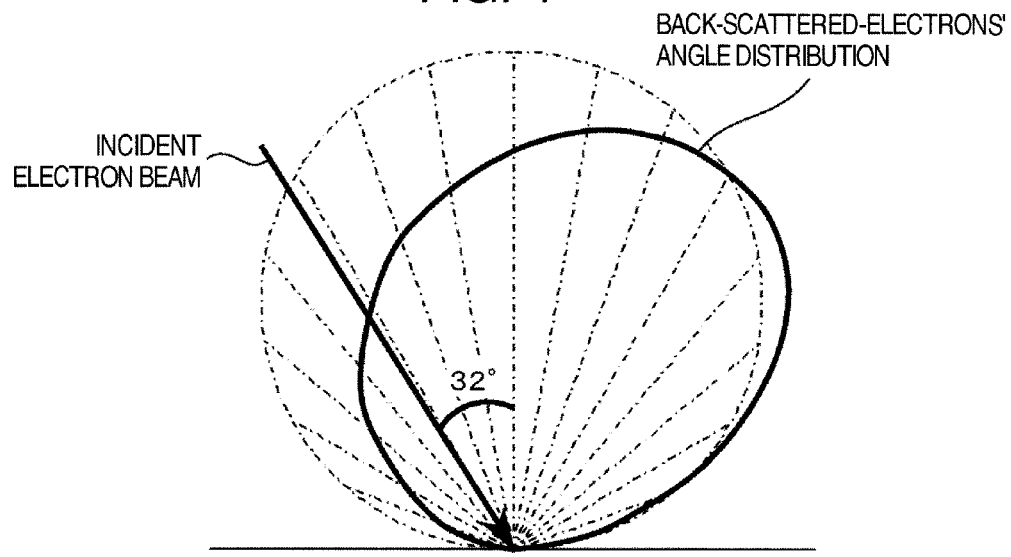
FIG. 4 is a diagram for illustrating an angle distribution of the back-scattered electrons at the time when the primary electrons enter the sample obliquely.

FIG. 4 illustrates the angle distribution at the time when $\theta$ is set at 32° and Si is employed as the sample 5. $\theta$ and $\Phi$ have the angle distributions at an almost equal angle. Accordingly, the low-loss-electron detector 7 illustrated in FIG. 1 and FIG. 2 is deployed on an axis which, within the area 8, is implemented as a result of performing a rotation in which $\Phi$ is set at the almost equal angle to $\theta$, i.e., the $2\theta$ rotation measured from the axis of the electron beam 2b. As long as the detector 7 does not interfere with the other units installed in the sample chamber 3, it is desirable to design the detector so that the widest-possible solid angle $\Omega$ can be ensured.

The explanation given so far is about the FIB-SEM dual-beam device where the ion-beam column 1a stands upright. The explanation, however, remains basically the same in the case of the FIB-SEM dual-beam device where the electron-beam column 2a stands upright. The deployment relationship of the low-loss-electron detector 7 is uniquely determined by its relationship with the ion-beam column 1a, the electron-beam column 2a, and the direction of the ion-beam-fabricated cross-section.

Figure 6:
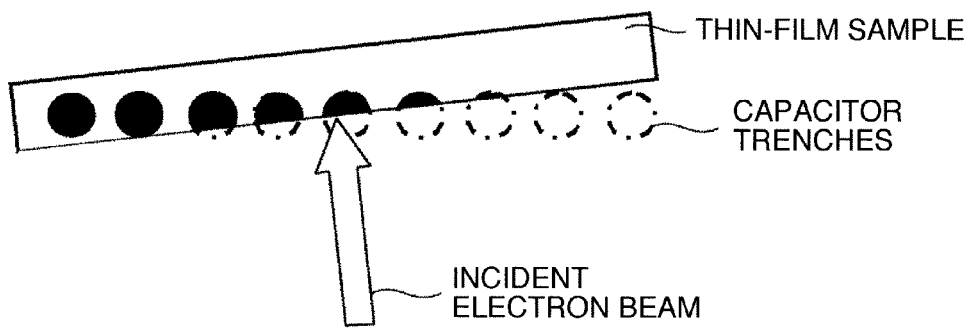
FIG. 6 is a diagram for illustrating an embodiment of the formation of a thin-film sample used in the experiment.
Figure 7:
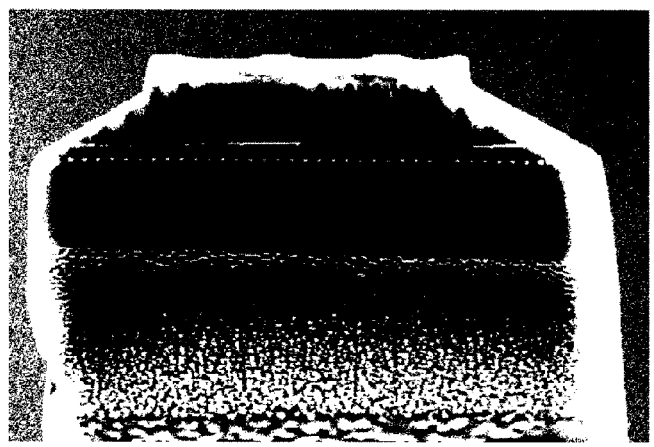
FIG. 7 is a diagram for illustrating the comparison between a secondary-electron image and a low-loss SEM image.
Figure 7:
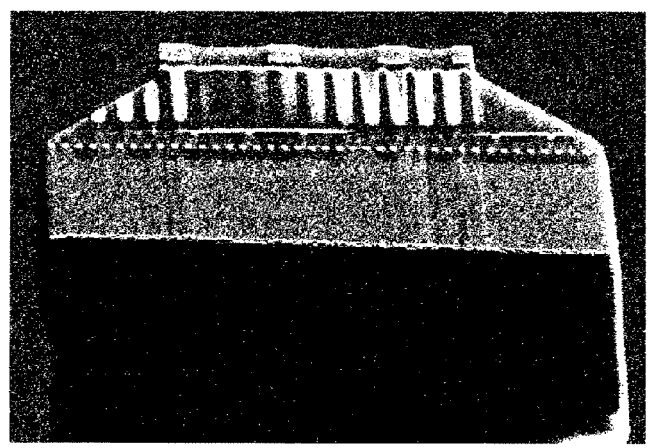

Hereinafter, the explanation will be given below concerning the LLE-based observation of the FIB-fabricated sample's cross-section. FIG. 6 is a diagram for illustrating an embodiment of the formation of a thin-film sample used in this experiment. As illustrated in FIG. 6, the thin-film sample is prepared which is FIB-fabricated in such a manner that a plurality of capacitor trenches in a semiconductor device exist not only in its inside but also on its surface. A thin-film sample like this is observed at a high acceleration voltage, e.g., 15 kV, by using the secondary-electron detector 6. This observation allows acquisition of an image as is illustrated in FIG. 7(a), where the FIB-fabricated cross-section is exceedingly planar, and where the topographic contrast is emphasized only at its edge portions. Meanwhile, before the back-scattered electrons are released out into the vacuum, secondary electrons are generated inside the thin-film sample by the back-scattered electrons, then being released out into the vacuum. Secondary electrons like this are generally referred to as "SEs 2". The secondary electrons generated and released by purely performing the mutual interaction with the primary electron beam are referred to as "SEs 1". As long as only the SEs 1 are detected, the information about the sample's surface can be obtained. The secondary-electron detector 6, however, detects both of the SEs 1 and the SEs 2. As a result, the contrasts to be obtained change, depending on a ratio between both of the secondary electrons released. In particular, since the SEs 2 are generated by the back-scattered electrons, the SEs 2 reflect to some extent the information about the inside of the sample and the material and composition contrasts about the sample. The higher the acceleration voltage becomes, the wider the mutual-interaction area becomes between the primary electron beam and the sample. As a result, the ratio of the SEs 2 increases, and thus the material and composition contrasts can be obtained. The information about the inside of the sample, however, is contained in the resultant information obtained. Accordingly, it turns out that, even if the beam's probe diameter is small, the actually-obtained image becomes an image which looks blurred as a whole. Conversely, the lower the acceleration voltage becomes, the narrower the mutual-interaction area becomes between the primary electron beam and the sample. As a result, it becomes impossible to make the distinction between the SEs 1 and the SEs 2. Consequently, the beam's probe diameter becomes larger, although the surface, material, and composition contrasts can be obtained.

Figure 8:
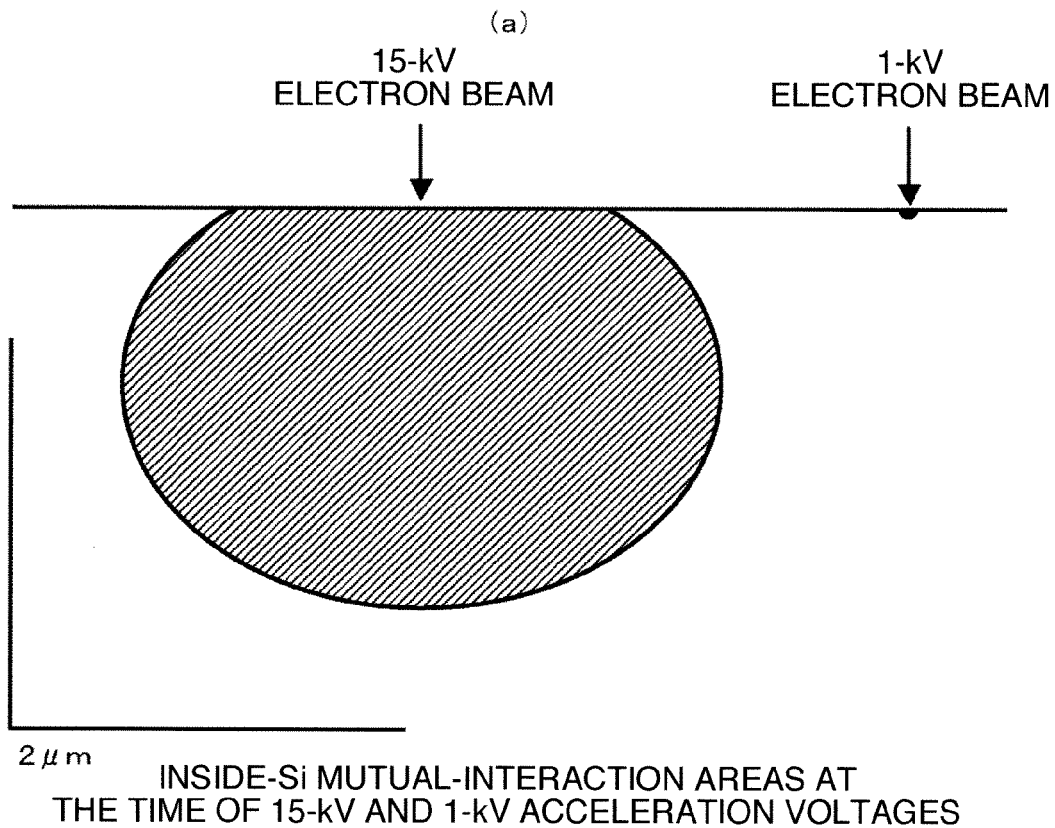
FIG. 8 is a diagram for illustrating the incident energies and the mutual-interaction areas of the electron beam, and a conceptual diagram for illustrating the relationship between the acceleration voltage and the beam's probe diameter on the basis of a difference in the lens scheme.
Figure 8:
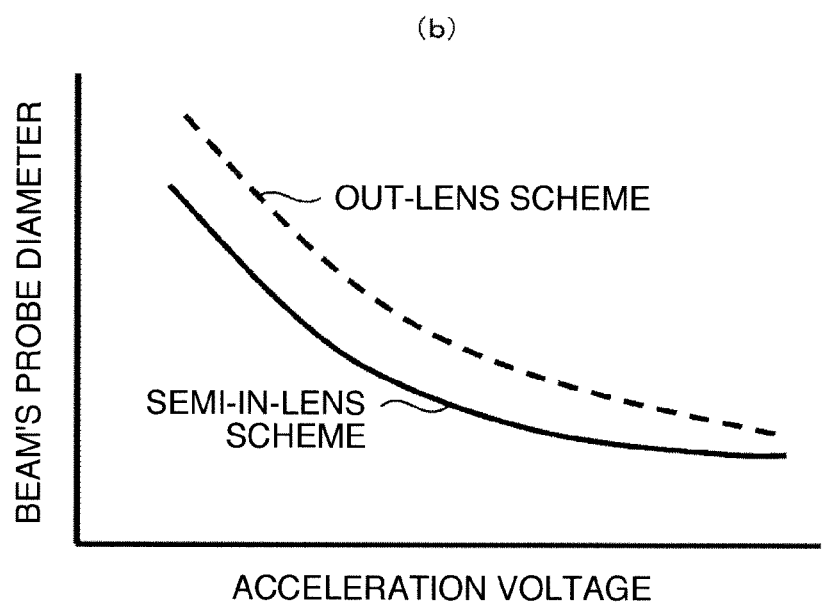

The relationship between the probe diameter and the spread of the electrons to be detected can be understood from FIG. 8. FIG. 8 (a) illustrates a difference in the mutual-interaction area when 1 kV and 15 kV electron beams enter Si. FIG. 8 (b) illustrates the lens-type-based relationship between the acceleration voltage and the beam's probe diameter. If it is wished to acquire the surface information more, a lower acceleration voltage is selected. Meanwhile, if it is wished to perform the higher-resolution observation with a smaller beam's probe diameter, a higher acceleration voltage is selected. Conversely, selecting the lower acceleration voltage results in enlargement of the beam's probe diameter; whereas selecting the higher acceleration voltage results in inclusion of wide-area information inside the sample. When the observation is performed with the higher resolution, the selection is made to a semi-in-lens-type SEM objective lens which positively causes the magnetic field to leak out into the sample. An out-lens-type SEM objective lens, which does not permit the magnetic field to leak out onto the sample side, is exceeded by the semi-in-lens-type lens in its resolution. Nevertheless, employing the out-lens-type lens at 30 kV allows acquisition of 1.6 nm-or-less resolution at the cross point at which the WD becomes equal to 4 mm or more. Consequently, this employment becomes more advantageous than the case where the lower acceleration voltage is employed in the semi-in-lens-type lens. Furthermore, the employment of the out-lens-type lens does not permit the leakage of the magnetic field. This feature allows accomplishment of the most significant advantage that the SEM observation becomes executable while the FIB fabrication is underway. Anyway, however, the selection of the higher acceleration voltage results in the inclusion of the wide-area information inside the sample.

Here, however, the detection of the low-loss electrons makes it possible to solve a problem like this. Namely, the thin-film sample is observed at the 15 kV acceleration voltage by using the low-loss-electron detector 7 where the energy width to be detected is set at 750 V (i.e., 5% of the 15 kV acceleration voltage). This observation allows acquisition of an image as is illustrated in FIG. 7(b). In comparison with the image illustrated in FIG. 7(a) and observed by using the secondary-electron detector 6, the following results can be clearly recognized: Namely, the contrast of the capacitor trenches appears conspicuously on the sample's surface. Moreover, the material and composition contrasts also appear conspicuously. Changing the setting for the energy width also allows acquisition of the depth-dependent contrast from the sample's surface to its inside.

Figure 9:
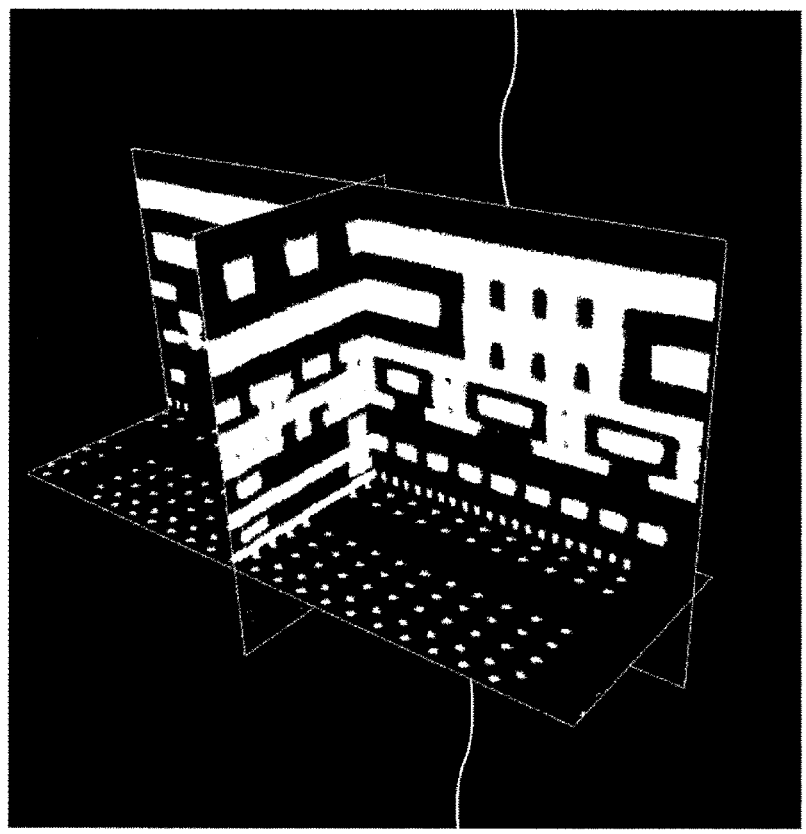
FIG. 9 is a diagram for illustrating an embodiment of the cross-section slice of three-dimensionally reconstructed image data in the horizontal direction.

Furthermore, the low-loss electrons are signals which are inherently caused to occur by the back-scattered electrons. In particular, the low-loss electrons are electrons whose energy is substantially equal to that of the primary electron beam. Accordingly, there also exists an advantage that the charge-up of an insulating layer or polymer material's cross-section, which is often used in a semiconductor device, does not appear in the contrast. An advantage like this becomes very advantageous in the Mill & Monitor function which is characteristic of the FIB-SEM dual-beam device, i.e., the function of setting up a specific fabrication step, and repeating the FIB fabrication and the SEM observation. Usually, an image acquired using the Mill & Monitor function is three-dimensionally reconstructed by setting up the fabrication step or an arbitrary width. The three-dimensionally-reconstructed data is utilized for the understanding of the sample's inner structure such as the case of tomography. Also, since the fabrication target cannot be seen from the ion-beam side, the SEM observation of the fabricated cross-section is required to be performed. If, however, the three-dimensionally-reconstructed structure is an already known sample, as is illustrated in FIG. 9, it is possible to slice the fabricated cross-section in the horizontal-surface direction on the three-dimensionally-reconstructed data. It is also possible to accurately identify the fabrication position in such a manner that the lower-most pattern included in the target is superimposed on the upper-most pattern observable by the FIB.

As is obvious from FIG. 1, the electron beam enters the sample obliquely with a certain angle held. Accordingly, when compared with the vertically-entering case, the information in the depth direction will appear in the longitudinal direction of the SEM image. On account of this circumstance, unless the surface information is acquirable, the SEM image will be three-dimensionally reconstructed, including this depth information as well. This situation makes it impossible to acquire the accurate sample's inner structure. Meanwhile, if the charge-up is present, a bright contrast will appear within the SEM image, despite the fact that there exists none of a real structure. As a consequence, the three-dimensional reconstruction of the SEM image results in the creation of the following image's representation: Namely, the image is represented as if a structure existed at a location where there exists none of a real structure. The Mill & Monitor function where the low-loss electrons are utilized makes it possible to avoid the above-described problem.

Figure 10:
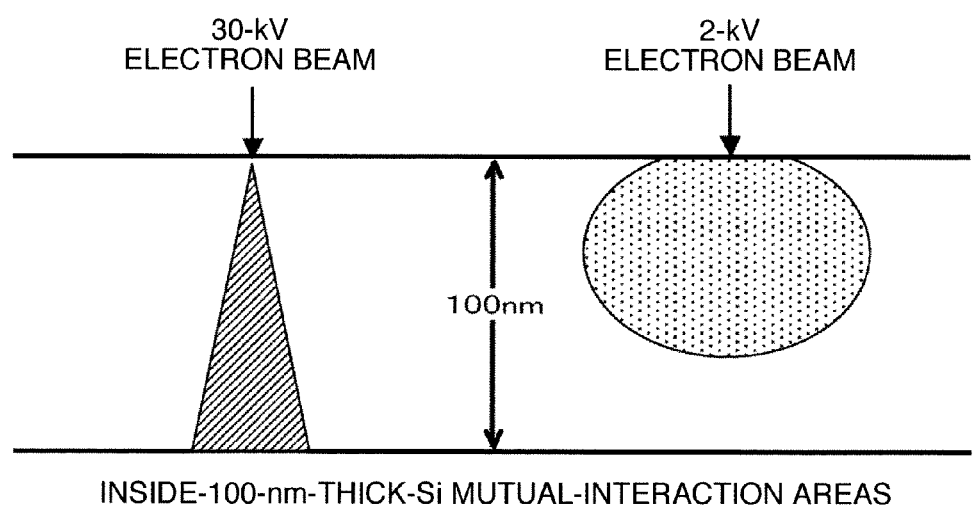
FIG. 10 is a diagram for illustrating the electron beam, the incident energy, and the mutual-interaction area in the thin film.

As having been explained so far, in the electron-beam observation of the exceedingly planar and microscopic sample's cross-section and edge plane fabricated by using the ion beam, the employment of the high acceleration voltage and the low-loss electrons allows the implementation of the large number of advantages. In particular, when it comes to the case where the sample is a 300-nm-or-less thin film, an even more characteristic advantage becomes implementable. In the low-dielectric-constant advanced device material referred to as "Low-k material", and the polymer-based advanced functional materials, the damage to these materials caused by the electron-beam irradiation becomes the serious problem. It is assumed from FIG. 8 (a) that, the higher the acceleration voltage becomes, the more serious problem the accumulation of the electron beam into the sample becomes. Nevertheless, when it comes to the case where the sample is the thin film, as is illustrated in FIG. 10, raising the acceleration voltage of the electron beam causes the electron beam to pass through the sample conversely. As a result, the accumulation of the electron-beam damage inside the sample becomes smaller. The higher the acceleration voltage is raised, and the thinner the thin-film sample is made, the more conspicuous this effect becomes. In general, the film thickness of the TEM-analysis-dedicated thin-film sample is equal to 100 nm or less. In the advanced device material and the advanced functional materials, the formation of the thin-film sample is requested whose film thickness is equal to 50 nm or less. Also, the typical highest acceleration voltage of the FIB-SEM device at the present point-in-time is equal to 30 kV. Consequently, it can become a very effective method to set up the acceleration voltage at 30 kV in accomplishing an object of the formation of the thin-film sample composed of the advanced device material and the advanced functional materials.

Figure 11:
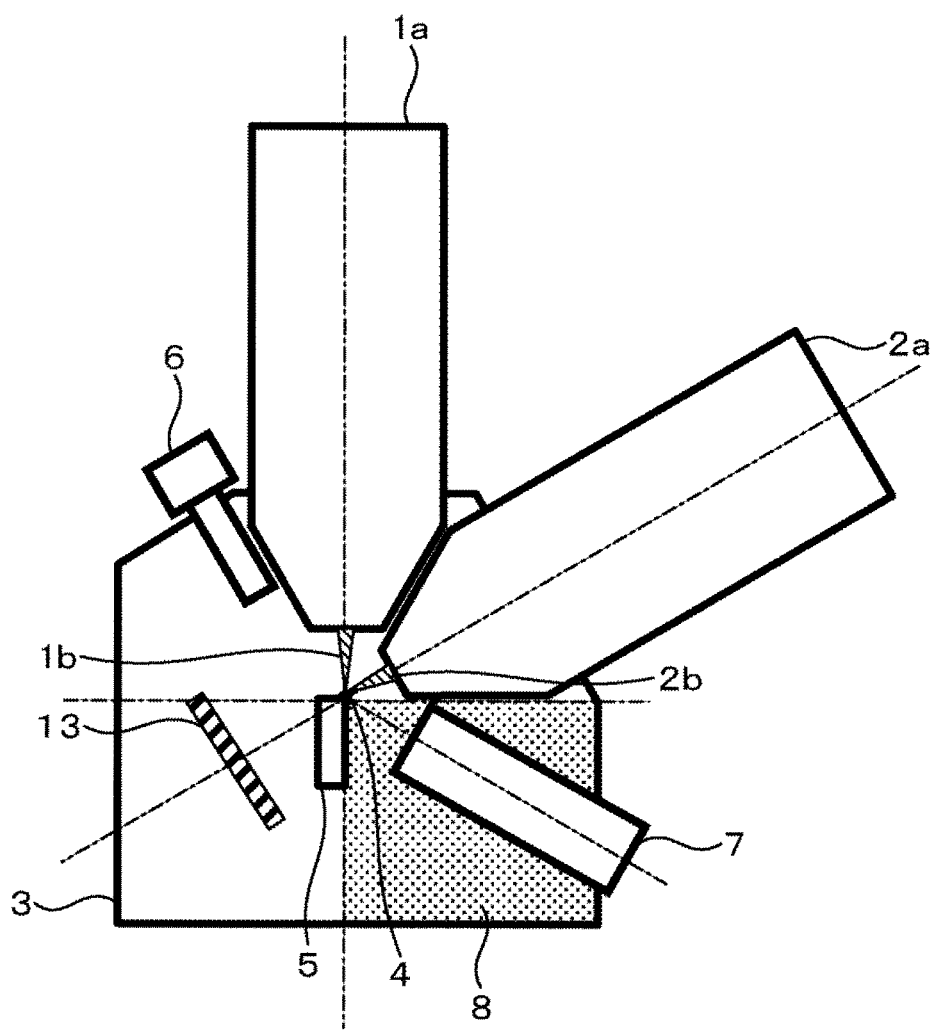
FIG. 11 is a longitudinal cross-sectional diagram for illustrating an embodiment of configuration of the composite charged particle beams apparatus.

As a FIB-SEM device which utilizes the characteristics that most of the incident electron beam passes through the sample, the following device is conceivable: Namely, as illustrated in FIG. 11, a STEM detector 13 is set up on the axis of the electron-beam column 2a in the opposite-surface direction of the FIB-fabricated cross-section which the electron beam enters. The transmitted electrons, which have passed through the sample, include crystallographic-structure information and composition information inside the thin-film sample. The STEM detector includes a bright-field (:BF) detector for mainly detecting diffraction contrast of the crystal, a dark-field (:DF) detector for detecting contrast of the material's composition, and a high-angle annular dark-field (:HAADF) detector. The STEM contrast basically indicates the sample's inner information. Accordingly, the combined use of the STEM detector 13 and the low-loss-electron detector 7 makes it possible to acquire various information about the sample's surface and inside. Both of the detectors 13 and 7 can be driven even while the FIB fabrication is underway. In particular, both of the detectors become very important functions as the units for judging and determining a FIB-fabrication end point at the time of the formation of the thin-film sample. Namely, it is judged to what extent the FIB fabrication should be progressed, while confirming the inner information by using the STEM detector 13. Moreover, by confirming the surface information and material's composition information acquired by the low-loss-electron detector 7, and the crystallographic-structure information and composition information acquired by the STEM detector 13, it becomes possible to enhance the determination accuracy of the position at which the FIB fabrication should be stopped.

Figure 5:
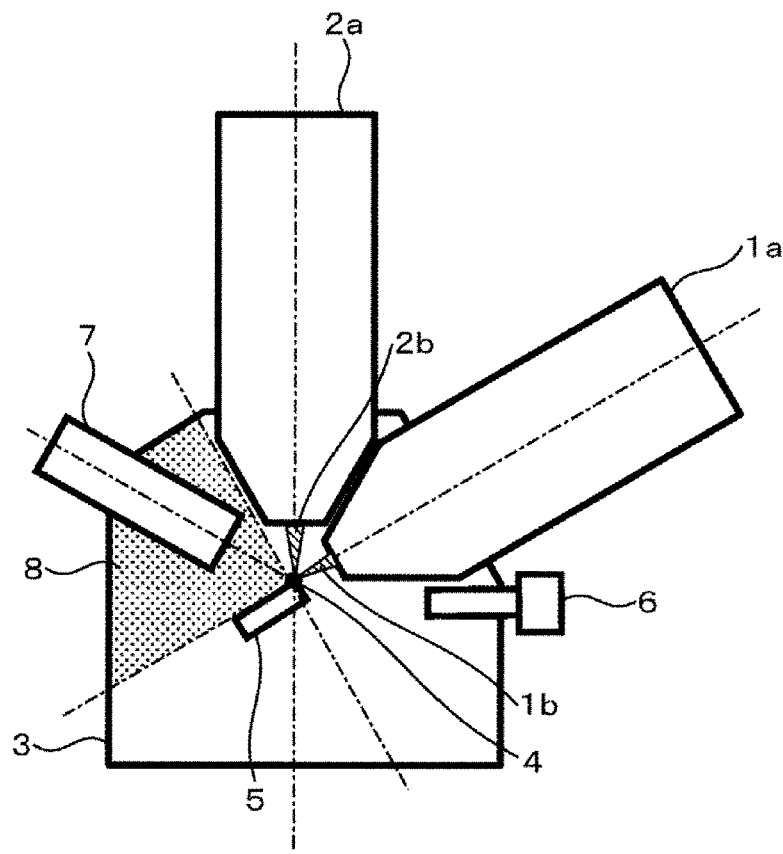
FIG. 5 is a longitudinal cross-sectional diagram for illustrating an embodiment of configuration of the composite charged particle beams apparatus.

It is assumed that the areas and angles of the detector deployment in the embodiments illustrated in FIG. 1, FIG. 5, and FIG. 11 are implemented in the out-lens mode where the magnetic field is not permitted to leak out onto the sample side. The back-scattered electrons displace inside the sample chamber isotropically, then arriving at the LLE detector. The device employed as the LLE detector is of the easy-to-configure electrostatic-filter type. The conditions like these allow accomplishment of the most significant advantage that the FIB fabrication and the SEM and STEM observations become simultaneously executable. Excluding this point of the simultaneous fabrication and observations, however, it is also possible to perform the SEM observation in the semi-in-lens mode where the beam's probe diameter is smaller, and where the higher-resolution observation is executable. Incidentally, in this case, the leakage magnetic field curves the back-scattered electrons, thereby giving rise to a variation in their incident angles into the detector. Accordingly, it is difficult to apply the electrostatic-filter-type detector. Nevertheless, it is not necessary to perform the energy discrimination of only the low-loss electrons, and to guide the energy-discriminated low-loss electrons to the detector. Instead, the energy range of all of the back-scattered electrons is detected by using the detector. Then, a detection system is employed which allows the output of a pulse height that is proportional to the energy of the back-scattered electrons detected. The employment of this detection system makes it possible to select only the pulse height corresponding to the energy of the elastically-scattered electrons or the low-loss electrons, thereby allowing the image formation of the pulse height. The most significant feature of a detection system like this is to be able to cause it to function not only as the energy's high-pass filter, but also as energy's low-pass and band-pass filters.

When the low-loss electrons are utilized, only the back-scattered electrons in a specific energy range are detected. As a result, the electrons' yield becomes lowered. On account of this condition, acquiring the image of the low-loss electrons with a sufficient signal-to-noise ratio necessitates a lapse of 1 minute-or-more time. If, however, the FIB-fabrication end point is judged while performing the SEM observation simultaneously with the FIB fabrication, it is desirable to be able to acquire the image with a lapse of 10-second-or-less time.

Figure 12:
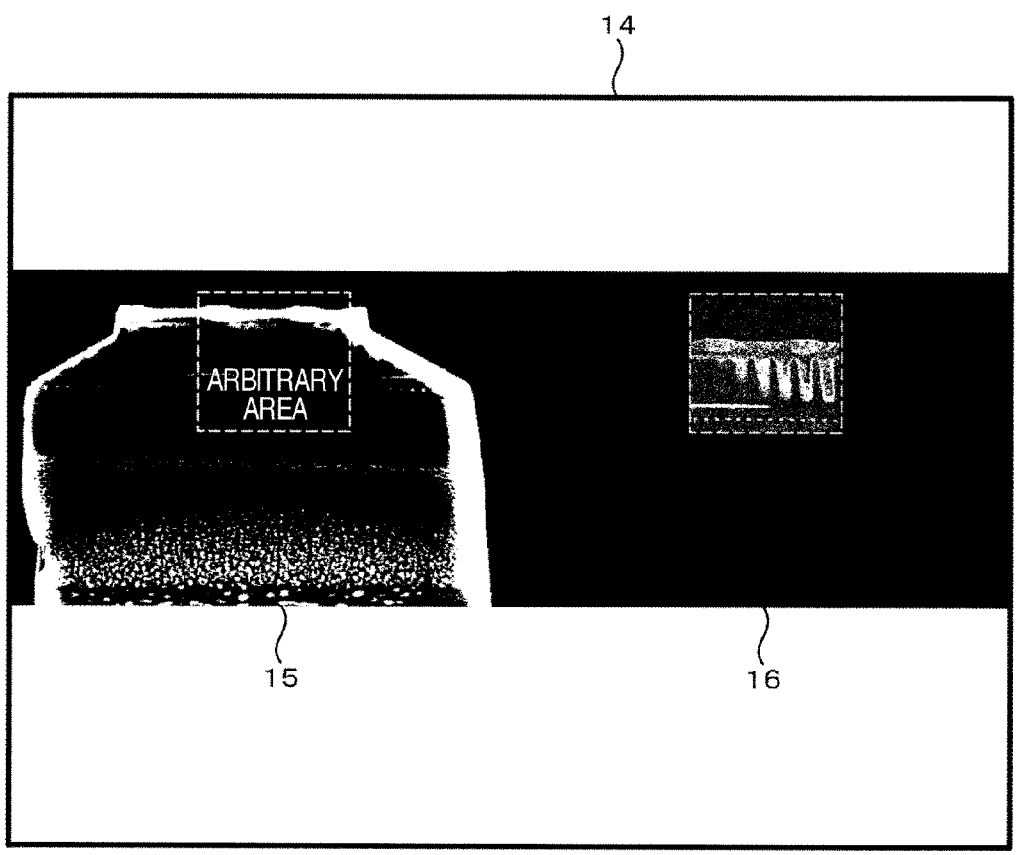
FIG. 12 is a diagram for illustrating an embodiment of a SEM-image display unit for shortening the SEM-image acquisition time.
Figure 13:
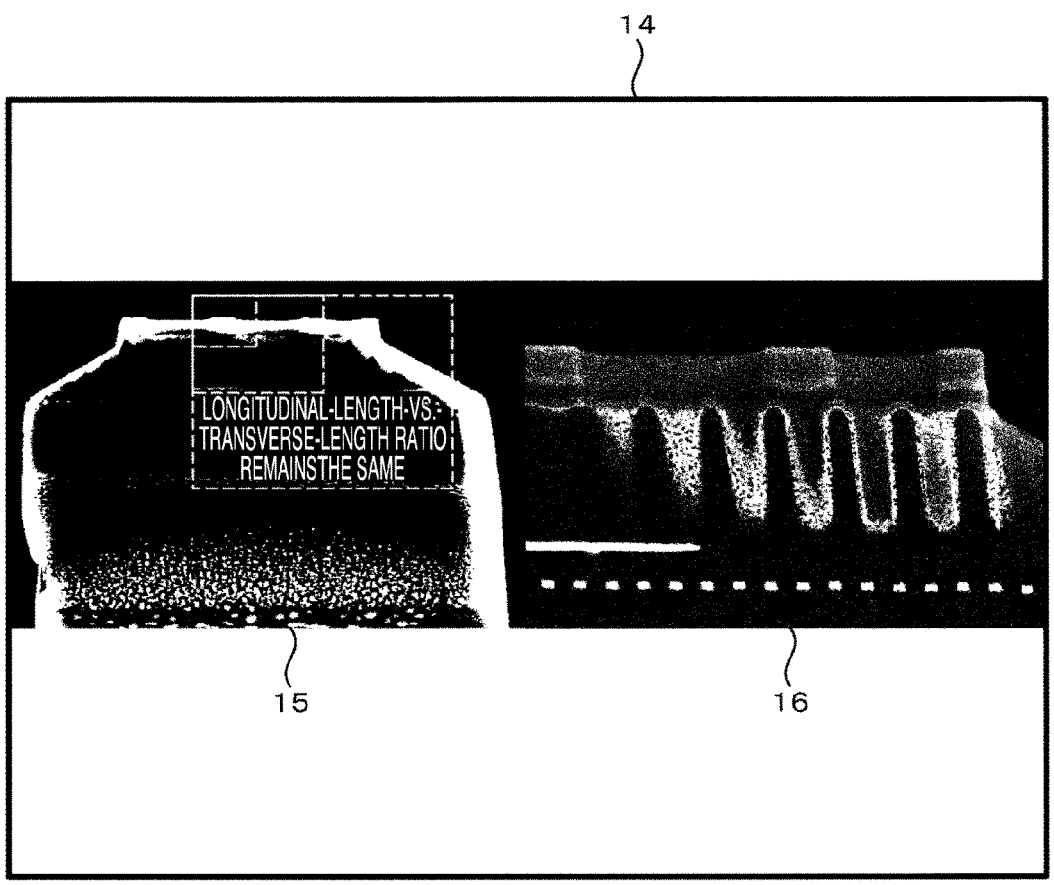
FIG. 13 is a diagram for illustrating an embodiment of the SEM-image display unit for shortening the SEM-image acquisition time.
Figure 14:
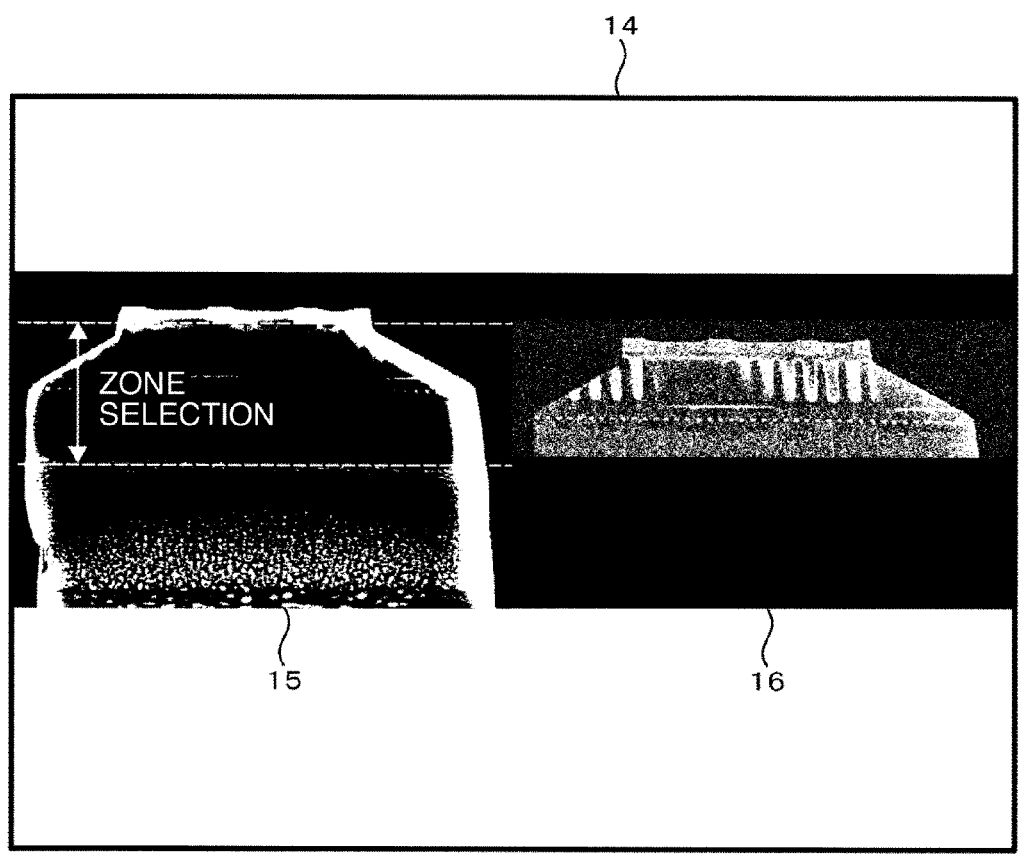
FIG. 14 is a diagram for illustrating an embodiment of the SEM-image display unit for shortening the SEM-image acquisition time.

FIG. 12 illustrates an embodiment of a dual-screen-mode-configured SEM-observation image display unit 14 which is equipped with a function of shortening the signal acquisition time in a seems-to-be manner. On the left side, a specific area is set up while displaying a secondary-electron image (i.e., secondary-electron image display & area set-up unit 15). On the right side, the low-loss-electron image is displayed only in the specific area set up on the left side (i.e., area-set-up low-loss-electron image display unit 16). When the detection of the FIB-fabrication end point is carried out in the formation of the thin-film sample of a semiconductor device, the following condition is conceivable: Namely, it is just all right in many cases to be able to observe only a specific area of the FIB-fabricated cross-section. Based on this condition, the signal acquisition time is shortened by performing the image display of only the specific area without performing the image display of the entire SEM image. For example, with respect to the acquisition of a SEM image which has necessitated a lapse of 80 seconds, trying to perform the acquisition of only ¹⁄₁₆th of the entire area of this image makes it possible to perform the SEM-image acquisition with a lapse of 5 seconds. The image-acquiring area, within which the SEM image is to be acquired, can be downsized into an arbitrary size. In the case of an arbitrary-downsized image whose longitudinal-length-vs.-transverse-length ratio is fixed, as illustrated in FIG. 13, this arbitrary-downsized image can be displayed in a manner of being magnified into its original size by being subjected to such processings as pixel interpolation and noise elimination. Here, these processings are performed after the image acquisition by using an image processing function. Also, in many cases, a semiconductor device is equipped with a periodic structure on its FIB-fabricated cross-section. Accordingly, the image can also be acquired by specifying the image-acquiring area with a line profile as is illustrated in FIG. 14. Incidentally, in the embodiments illustrated in FIG. 12 and FIG. 14, the dual-screen-mode configuration is given where the specific area is set up in the left-side image display unit, and where the image is displayed in the right-side image display. Basically the same setting, however, is also implementable in the single-screen mode or plural-screen mode. Also, in the embodiments illustrated in FIG. 12 to FIG. 14, the secondary-electron image is displayed on the left side, and the low-loss-electron image is displayed on the right side. The image display units, however, allow implementation of the selection and display of the signals which are detected by all of the detectors installed in the device.

INDUSTRIAL APPLICABILITY

The present invention is capable of providing the device which allows execution of the high-resolution and low-damage SEM observation of material, composition, and surface information, or depth information on the FIB-fabricated cross-section or edge plane in the FIB-SEM device. This execution is performed in a manner of being simultaneous with the FIB fabrication, or being switched for the FIB fabrication. The device allows implementation of the high-quality and high-accuracy formation of a thin film composed of the most-advanced device and functional materials. This feature permits implementation of a dramatic enhancement in the analysis accuracy and convenience.

REFERENCE SIGNS LIST 1a ion-beam column, 1b ion beam, 2a electron-beam column, 2b electron beam, sample chamber, 4 cross point, 5 sample, 6 secondary-electron detector, 7 low-loss-electron detector, 8 area, 9 ion-beam-induced secondary electrons, 10 electron-beam-induced secondary electrons, 11 electron-beam-induced back-scattered electrons, 12 energy area of reflected electrons and low-loss electrons, 13 STEM detector, 14 SEM-observation image display unit, 15 secondary-electron image display & area set-up unit, 16 area-set-up low-loss-electron image display unit, 28 surface

The invention claimed is:

1. A composite charged particle beams apparatus for observing a sample's cross-section by using an electron beam, said sample's cross-section being formed by using an ion-beam fabrication, wherein:
   said composite charged particle beams apparatus comprises a detector for detecting low-loss back-scattered electrons including elastically-scattered electrons, said low-loss back-scattered electrons being induced by said electron beam with which said sample's cross-section is irradiated; and
   said detector is deployed in a three-dimensional area which is oriented in a direction, said direction being implemented as a result of performing a 90° or-more rotation from an ion-beam incident axis into said cross-section such that a cross point of said ion beam and said electron beam is employed as center of said rotation.

2. The composite charged particle beams apparatus according to claim 1, wherein:
   said detector is deployed at an angle at which angle distribution of said back-scattered electrons exhibits the highest intensity, said angle distribution depending on an electron-beam incident angle into said cross-section.

3. The composite charged particle beams apparatus according to claim 2, further comprising:
   a display for displaying a detection signal from said detector by forming image of said detection signal,
   wherein an arbitrary range of said image displayed on said display is selected, and said selected range is image-displayed on said display.

4. The composite charged particle beams apparatus according to claim 1, wherein:
   said detector is deployed in a direction, and at an angle, said direction being away from said ion-beam incident axis with an electron-beam incident axis employed as its criterion, said angle being two times as large as an electron-beam incident angle into said sample.

5. The composite charged particle beams apparatus according to claim 4, further comprising:
   a display for displaying a detection signal from said detector by forming image of said detection signal,
   wherein an arbitrary range of said image displayed on said display is selected, and said selected range is image-displayed on said display.

6. The composite charged particle beams apparatus according to claim 1, wherein
   said detector is capable of detecting said low-loss back-scattered electrons in a case where acceleration voltage of said electron beam is set at its maximum value.

7. The composite charged particle beams apparatus according to claim 6, further comprising:
   a display for displaying a detection signal from said detector by forming image of said detection signal,
   wherein an arbitrary range of said image displayed on said display is selected, and said selected range is image-displayed on said display.

8. The composite charged particle beams apparatus according to claim 1, wherein
   said detector is capable of detecting said low-loss back-scattered electrons in a case where acceleration voltage of said electron beam is set within a range of 1.5 kV to 30 kV.

9. The composite charged particle beams apparatus according to claim 8, further comprising:
   a display for displaying a detection signal from said detector by forming image of said detection signal,
   wherein an arbitrary range of said image displayed on said display is selected, and said selected range is image-displayed on said display.

10. The composite charged particle beams apparatus according to claim 1, wherein
    surface information about said sample's cross-section can be acquired while said fabrication of said sample's cross-section by using said ion beam is underway.

11. The composite charged particle beams apparatus according to claim 10, further comprising:
    a display for displaying a detection signal from said detector by forming image of said detection signal,
    wherein an arbitrary range of said image displayed on said display is selected, and said selected range is image-displayed on said display.

12. The composite charged particle beams apparatus according to claim 1, wherein
    surface information about said sample's cross-section can be acquired after said fabrication onto said sample's cross-section by using said ion beam is stopped.

13. The composite charged particle beams apparatus according to claim 12, further comprising:
    a display for displaying a detection signal from said detector by forming image of said detection signal,
    wherein an arbitrary range of said image displayed on said display is selected, and said selected range is image-displayed on said display.

14. The composite charged particle beams apparatus according to claim 1, wherein
    said fabrication of said sample's cross-section by using said ion beam, and acquisition of surface information about said sample's cross-section can be carried out repeatedly.

15. The composite charged particle beams apparatus according to claim 14, wherein:

surface-information images of said sample's cross-section are acquired when said ion-beam fabrication and said electron-beam observation are repeated on each specific-fabrication-step basis, and said surface-information images can be three-dimensionally reconstructed by superimposing said surface-information images on each other on the basis of a fabrication step's width or an arbitrary width.

16. The composite charged particle beams apparatus according to claim 15, wherein
said fabrication step's width is equal to 5 nm or less.

17. The composite charged particle beams apparatus according to claim 16, further comprising:
a display for displaying a detection signal from said detector by forming image of said detection signal,
wherein an arbitrary range of said image displayed on said display is selected, and said selected range is image-displayed on said display.

18. The composite charged particle beams apparatus according to claim 15, further comprising:
a display for displaying a detection signal from said detector by forming image of said detection signal,
wherein an arbitrary range of said image displayed on said display is selected, and said selected range is image-displayed on said display.

19. The composite charged particle beams apparatus according to claim 14, further comprising:
a display for displaying a detection signal from said detector by forming image of said detection signal,
wherein an arbitrary range of said image displayed on said display is selected, and said selected range is image-displayed on said display.

20. The composite charged particle beams apparatus according to claim 1, further comprising:
a second detector for detecting an electron beam which has passed through a thin-film sample,
wherein surface information about said sample's cross-section and inner information about said thin-film sample can be simultaneously acquired while fabrication of said thin-film sample by using said ion beam is underway.

21. The composite charged particle beams apparatus according to claim 20, wherein
thickness of said thin-film sample is equal to 300 nm or less.

22. The composite charged particle beams apparatus according to claim 21, further comprising:
a display for displaying a detection signal from said detector by forming image of said detection signal,
wherein an arbitrary range of said image displayed on said display is selected, and said selected range is image-displayed on said display.

23. The composite charged particle beams apparatus according to claim 20, further comprising:
a display for displaying a detection signal from said detector by forming image of said detection signal,
wherein an arbitrary range of said image displayed on said display is selected, and said selected range is image-displayed on said display.

24. The composite charged particle beams apparatus according to claim 1, further comprising:
a second detector for detecting an electron beam which has passed through a thin-film sample,
wherein surface information about said sample's cross-section and inner information about said thin-film sample can be simultaneously acquired after fabrication onto said thin-film sample by using said ion beam is stopped.

25. The composite charged particle beams apparatus according to claim 24, wherein
thickness of said thin-film sample is equal to 300 nm or less.

26. The composite charged particle beams apparatus according to claim 25, further comprising:
a display for displaying a detection signal from said detector by forming image of said detection signal,
wherein an arbitrary range of said image displayed on said display is selected, and said selected range is image-displayed on said display.

27. The composite charged particle beams apparatus according to claim 24, further comprising:
a display for displaying a detection signal from said detector by forming image of said detection signal,
wherein an arbitrary range of said image displayed on said display is selected, and said selected range is image-displayed on said display.

28. The composite charged particle beams apparatus according to claim 1, further comprising:
a second detector for detecting an electron beam which has passed through a thin-film sample,
wherein said fabrication of said sample's cross-section by using said ion beam, acquisition of surface information about said thin film's cross-section, and acquisition of inner information about said thin film can be carried out repeatedly.

29. The composite charged particle beams apparatus according to claim 28, wherein
thickness of said thin-film sample is equal to 300 nm or less.

30. The composite charged particle beams apparatus according to claim 29, further comprising:
a display for displaying a detection signal from said detector by forming image of said detection signal,
wherein an arbitrary range of said image displayed on said display is selected, and said selected range is image-displayed on said display.

31. The composite charged particle beams apparatus according to claim 28, wherein:
surface-information images of said sample's cross-section are acquired when said ion-beam fabrication and said electron-beam observation are repeated on each specific-fabrication-step basis, and
said surface-information images can be three-dimensionally reconstructed by superimposing said surface-information images on each other on the basis of a fabrication step's width or an arbitrary width.

32. The composite charged particle beams apparatus according to claim 31, wherein
said fabrication step's width is equal to 5 nm or less.

33. The composite charged particle beams apparatus according to claim 32, further comprising:
a display for displaying a detection signal from said detector by forming image of said detection signal,
wherein an arbitrary range of said image displayed on said display is selected, and said selected range is image-displayed on said display.

34. The composite charged particle beams apparatus according to claim 31, further comprising:
a display for displaying a detection signal from said detector by forming image of said detection signal, wherein an arbitrary range of said image displayed on said display is selected, and said selected range is image-displayed on said display.

35. The composite charged particle beams apparatus according to claim 28, further comprising:
a display for displaying a detection signal from said detector by forming image of said detection signal,
wherein an arbitrary range of said image displayed on said display is selected, and said selected range is image-displayed on said display.

36. The composite charged particle beams apparatus according to claim 1, further comprising:
a display for displaying a detection signal from said detector by forming image of said detection signal,
wherein an arbitrary range of said image displayed on said display is selected, and said selected range is image-displayed on said display.

37. The composite charged particle beams apparatus according to claim 1, further comprising:
a display for displaying a detection signal from said detector by forming image of said detection signal,
wherein an arbitrary range of said image displayed on said display is selected, and said selected range is image-displayed on said display.

* * * * *